(12) United States Patent
Su et al.

(10) Patent No.: US 10,932,378 B2
(45) Date of Patent: Feb. 23, 2021

(54) CONNECTOR HAVING PINS EXTENDING TO MORE THAN ONE PRINTED CIRCUIT BOARD

(71) Applicant: Vitesco Technologies USA, LLC, Auburn Hills, MI (US)

(72) Inventors: Patrick Su, Shelby Township, MI (US); Christopher M Glennon, Shelby Township, MI (US)

(73) Assignee: Vitesco Technologies USA, LLC, Auburn Hills, MI (US)

(*) Notice: Subject to any disclaimer, the term of this patent is extended or adjusted under 35 U.S.C. 154(b) by 0 days.

(21) Appl. No.: 16/721,024

(22) Filed: Dec. 19, 2019

(65) Prior Publication Data

US 2020/0214151 A1 Jul. 2, 2020

Related U.S. Application Data

(60) Provisional application No. 62/786,499, filed on Dec. 30, 2018.

(51) Int. Cl.
*H05K 5/00* (2006.01)
*H01R 12/52* (2011.01)
*H01R 12/58* (2011.01)

(52) U.S. Cl.
CPC ......... *H05K 5/0069* (2013.01); *H01R 12/523* (2013.01); *H01R 12/58* (2013.01); *H05K 5/006* (2013.01)

(58) Field of Classification Search
CPC ........ H05K 1/144; H05K 1/145; H05K 1/141; H05K 2201/10303; H05K 2201/10515; H05K 5/0069; H05K 5/006; H01R 12/52; H01R 12/523; H01R 12/58; H01R 12/585
See application file for complete search history.

(56) References Cited

U.S. PATENT DOCUMENTS

| | | | | |
|---|---|---|---|---|
| 5,761,050 A | * | 6/1998 | Archer | H01R 12/585 361/744 |
| 10,435,060 B2 | * | 10/2019 | Hagiwara | B62D 5/0406 |
| 2014/0198467 A1 | * | 7/2014 | Shi | B60R 16/0238 361/752 |

* cited by examiner

*Primary Examiner* — Vanessa Girardi

(57) ABSTRACT

An electronics device is disclosed, including: a first printed circuit board having a plurality of through-holes; a second printed circuit board having a plurality of through-holes; a housing in which the first and second printed circuit boards are disposed, the first printed circuit board disposed above the second printed circuit board in the housing; and a connector attached to the housing and including a plurality of pins comprising first pins and a plurality of second pins, a length of the first pins being greater than a length of the second pins. Each of the first pins extends through one of the through-holes of the first printed circuit board and one of the through-holes of the second printed circuit board and thereby makes an electrical connection with the first and second printed circuit boards, and each of the second pins only extends through one of the through-holes of the second printed circuit board and thereby makes an electrical connection with the second printed circuit board.

18 Claims, 4 Drawing Sheets

CONNECTOR HAVING PINS EXTENDING TO MORE THAN ONE PRINTED CIRCUIT BOARD

CROSS-REFERENCE TO RELATED APPLICATION

The present application is related to and claims the benefit of provisional U.S. patent application 62/786,499, filed Dec. 30, 2018, and titled, "Connector Pins for Multiple Printed Circuit Boards," the content of which is hereby incorporated by reference herein in its entirety.

FIELD OF INVENTION

The present invention generally relates to an electrical connection for an electronics housing, and particularly to an electrical connector having a pin configuration for providing connectivity to multiple printed circuit boards.

BACKGROUND

Prior engine control modules stacked multiple printed circuit boards (PCBs) in one package. Such modules had a separate compliant pin assembly that joined PCBs together. FIG. 1 illustrates one such engine control module 1. This module 1 does not reduce PCB layout complexity. Power traces and signal traces interfere with each other and "fight" for space on the stacked PCBs 11, 9. Further, the primary (larger) PCB 11 is a high cost PCB due to a high number of PCB layers. Still further, the generally S-shaped connector 13 between the main PCB 11 and the daughter (smaller) PCB 9 is a complex part having a nontrivial manufacturing cost.

Prior engine control modules also have larger heights due to the S-shaped connector 13. The PCB layout in existing engine control modules are more complex and are expensive to manufacture as a result.

SUMMARY

Example embodiments are generally directed to an electronics device including a first printed circuit board having a plurality of through-holes; a second printed circuit board having a plurality of through-holes. The first and second printed circuit boards are disposed in a housing. The first printed circuit board is disposed above the second printed circuit board in the housing. A connector is attached to the housing and includes a plurality of pins, the pins including a plurality of first pins and a plurality of second pins. A length of the first pins is greater than a length of the second pins. In the example embodiments, each of the first pins extends through one of the through-holes of the first printed circuit board and one of the through-holes of the second printed circuit board and thereby makes an electrical connection with both the first and second printed circuit boards, and each of the second pins only extends through one of the through-holes of the second printed circuit board and thereby makes an electrical connection with the second printed circuit board.

Each first pin may include a first compliant portion which engages with the corresponding through-hole of the first printed circuit board, and a second compliant portion which engages with the corresponding through-hole of the second printed circuit board.

The first printed circuit board may have a square or rectangular prism shape and the first pins extend through the corresponding through-holes of the first printed circuit board that are defined along corner regions of the first printed circuit board.

The first printed circuit board may include at least one processor and/or microcontroller, and the second printed circuit board may include at least one electrical component having a heat sink or at least one discrete component. In an embodiment, the second printed circuit board includes no processor or microcontroller. In another embodiment, the processor of the first printed circuit board may be programmable and the second printed circuit board does not include a programmable component. In an embodiment, the electronics device is modular in that the first printed circuit board is one of a plurality of first printed circuit boards which are insertable in the electronics device, each of the first printed circuit boards being configured for different functionality relative to functionality of the other first printed circuit boards.

The first printed circuit board may be smaller than the second printed circuit board.

The connector may be positioned closer to the second printed circuit board than the first printed circuit board.

The electronics device may form at least part of a system, with the first pins carrying system signals and the second pins carrying power supply signals.

In an embodiment, the first pins are inserted in the through-holes of the first printed circuit board that are located along a first portion thereof, the electronics device includes at least one fastener which is inserted through the first and second printed circuit boards and engages with the housing, and the at least one fastener is disposed along a second portion of the first printed circuit board, the fastener and the first pins fixing the first printed circuit board in position within the housing.

In another example embodiment, a control unit includes: a housing; a first printed circuit board disposed in the housing and having a plurality of through-holes defined therethrough; and a second printed circuit board disposed in the housing and having a plurality of through-holes defined therethrough. The first and second printed circuit boards are in a stacked arrangement within the housing. A plurality of pins include a plurality of first pins and a plurality of second pins. Each of the first pins is configured to extend into a through-hole of the first printed circuit board and a through-hole of the second printed circuit board, and each second pin is configured to extend into a through-hole of the second printed circuit board. Each first pin may carry a power signal and each second pin may carry an input/output signal of the control unit.

The first printed circuit board may include at least one processor or controller and the second printed circuit board does not include a processor or controller.

The control unit includes a connector attached to the housing, wherein the first and second pins are disposed at least partly in and forming part of the connector.

Each first pin may include a first compliant pin portion which is inserted in a corresponding through-hole of the first printed circuit board and a second compliant pin portion which is inserted in a corresponding through-hole of the second printed circuit portion. The compliant pin portions thereby provide press-fit connections between the first pins and the first and second printed circuit boards.

The first printed circuit board may have a rectangular prism shape and the first pins extend through the through-holes of the first printed circuit board in corner regions thereof.

The first pins may extend through the through-holes of the first printed circuit board that are defined along a first portion thereof, and the control unit may further include one or more fasteners which extend through the first printed circuit board and engage with the housing. The one or more fasteners are positioned along a second portion of the first printed circuit board opposite the first portion thereof.

The first printed circuit board includes a processor or controller configured to perform a first set of functions, and the second printed circuit board is configured such that the first printed circuit board is interchangeable with a third printed circuit board configured to perform a second set of functions different from the first set of functions when the third printed circuit board replaces the first printed circuit board and is part of the control unit.

The first printed circuit board may be smaller than the second printed circuit board, and the second printed circuit board may include at least one electrical component having a height that is greater than a distance between the first and second printed circuit boards.

The example embodiments will reduce the cost of materials and/or parts of an electronics device by making it part of the electronic connector. The example embodiments reduce the overall height as well. The example embodiments further allow easier layout of the PCBs in a reduced space.

Low vibration electronics may want to use less multiple leaded compliant pins to save cost. High vibration electronics may fill all pins with a multiple leaded compliant pins to provide more robustness.

BRIEF DESCRIPTION OF THE DRAWINGS

Aspects of the invention will be explained in detail below with reference to exemplary embodiments in conjunction with the drawings, in which.

FURTHER DETAILED DESCRIPTION

The following description of the example embodiment(s) is merely exemplary in nature and is in no way intended to limit the invention, its application, or uses. In the figures and throughout the detailed description, the same reference numbers are used to identify identical or similar elements. For the sake of clarity; the elements are not shown to scale unless otherwise specified.

The example embodiments presented herein are generally directed to an electronics control unit (ECU) or other electronic device including a connector with pins, some of which are connected to multiple PCBs in the ECU. The pins that are connected to multiple PCBs save space otherwise necessary to route signals onto and between the PCBs, thereby allowing for the PCBs and the entire ECU to be smaller with less manufacturing cost.

Figure 5:
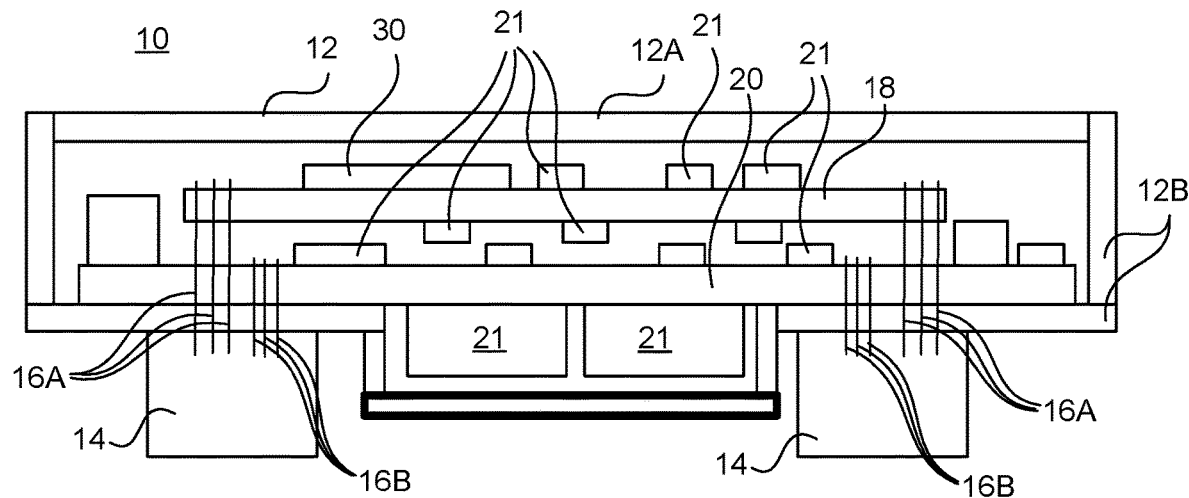
FIG. 5 is a simplified side view of an electronics control unit which incorporates the connector of FIG. 2, according to an example embodiment.

FIG. 5 illustrates an ECU 10 according to an example embodiment. ECU 10 includes a housing 12 which houses the components of ECU 10. Housing 12 may be formed from a metallic composition and have a first housing portion 12A and a second housing portion 12B which attaches to first housing portion 12A via fasteners, such as screws, adhesives or the like. In the illustrated embodiment, first housing portion 12A is a cover for housing 12. First housing portion 12A and second housing portion 12B, when attached together, define an inner space in which components of ECU 10 are disposed. In an example embodiment, first housing portion 12A and second portion 12B are sealingly attached to each other.

Figure 6:
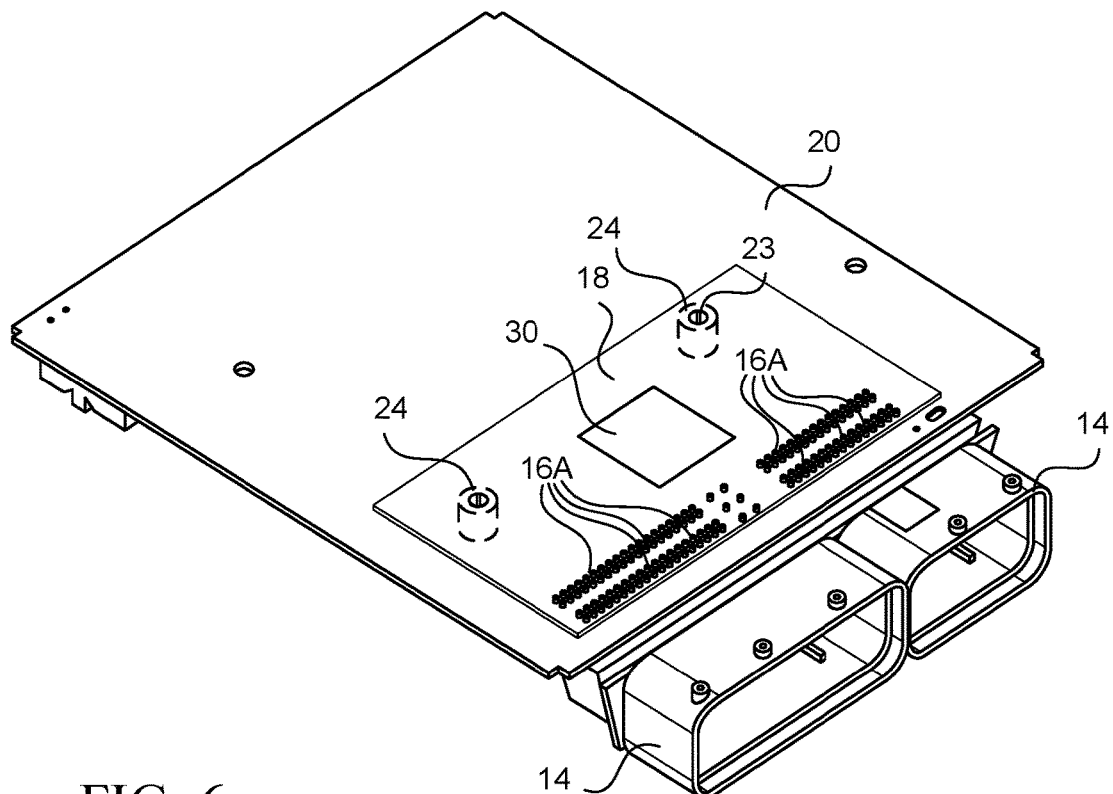
FIG. 6 is a perspective view of at least a portion of an electronics control unit according to an example embodiment.

As shown in FIGS. 2-5, ECU 10 further includes a connector 14 attached to housing 12 and particularly to second housing portion 12B. Like conventional connectors, connector 14 includes a plurality of electrical contacts which allow for electrical connections between signals internal to ECU 10 and devices and systems external to ECU 10. As shown in FIGS. 5 and 6, ECU 10 may include a plurality of connectors 14.

In one example embodiment, pins 16 extend within connector 14 to an outer end portion of connector 14, relative to housing 12, for physically contacting and electrically connecting to a female electrical contact of a connector which connects to connector 14. In another example embodiment, pins 16 are electrically connected within connector 14 to other electrical contacts which extend to the outer end portion of connector 14. Such other electrical contacts are, in an example embodiment, female electrical contacts for electrically connecting to male electrical contacts of a connector which connects to connector 14. In this way, the electrical contacts at the outer end portion of connector 14 may be configured for establishing electrical connections with virtually any connector which engages with connector 14.

It is understood that ECU 10 may include more than one connector 14 attached to housing 12.

With continued reference to FIG. 5, ECU 10 further includes a first PCB 18 and a second PCB 20 which are disposed within housing 12. First PCB 18 and second PCB 20 are fixedly disposed within housing 12 in parallel with each other. In the embodiment illustrated, second PCB 20 is disposed nearer to connector 14 than first PCB 18, but it is understood that first PCB 18 may be disposed nearer to connector 14. First PCB 18 and second PCB 20 are arranged in a stacked arrangement within housing 12 of ECU 10. First PCB 18 and second PCB 20 each includes electrical and/or electronic components 21 secured thereto.

Figure 1:
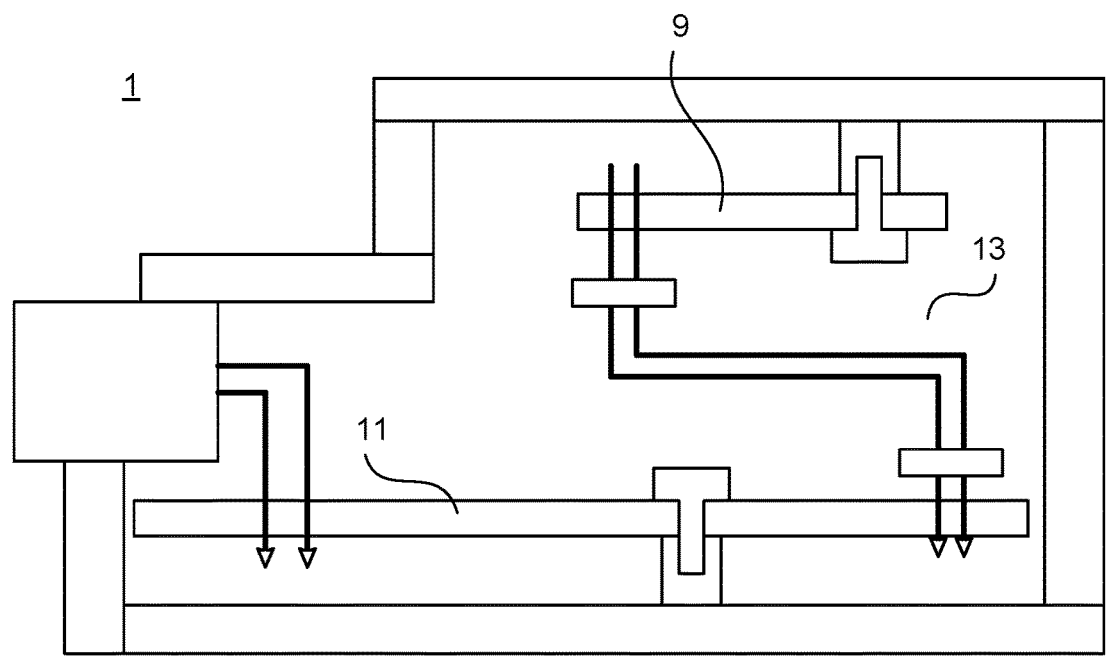
FIG. 1 is a simplified side view of an existing electronics control unit.
Figure 2:
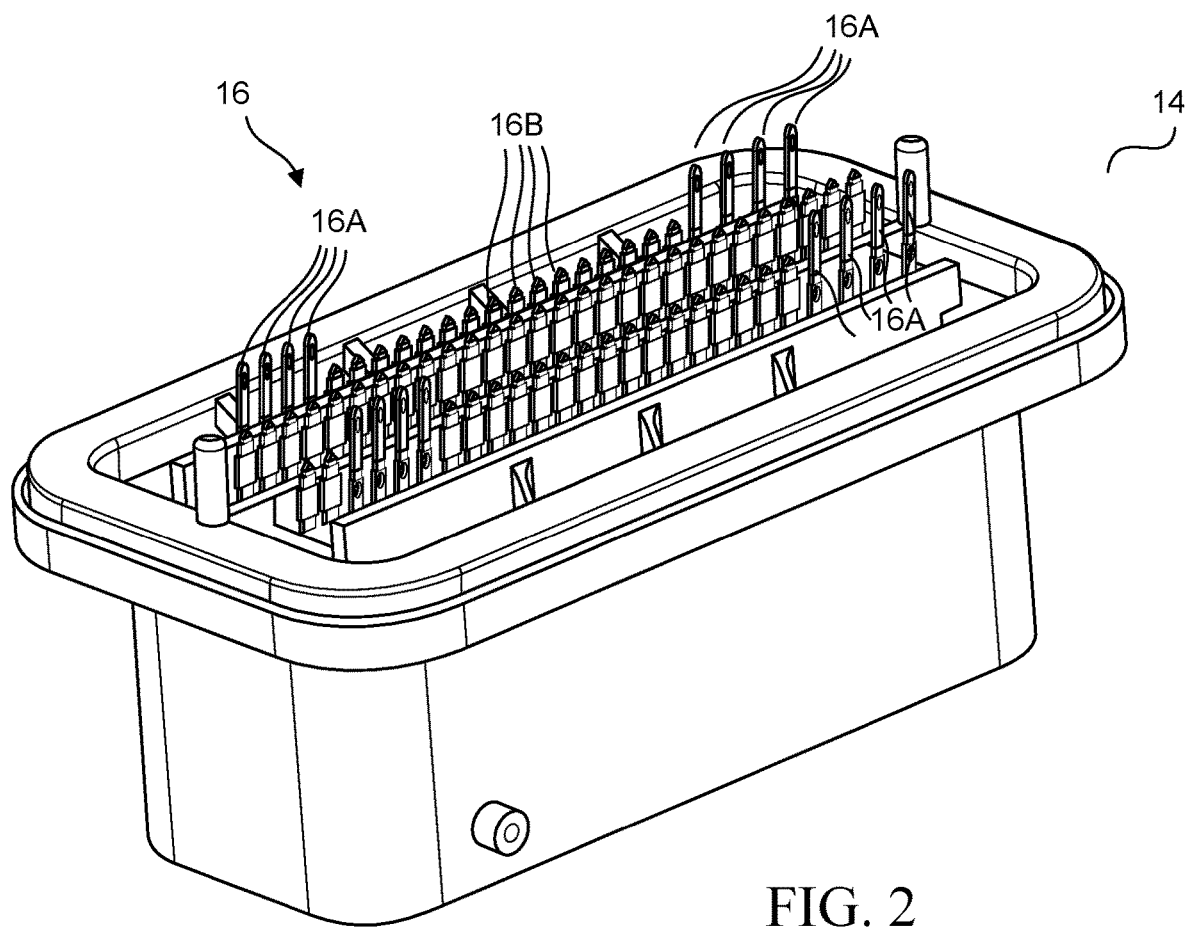
FIG. 2 is a perspective view of a connector according to an example embodiment.
Figure 3:
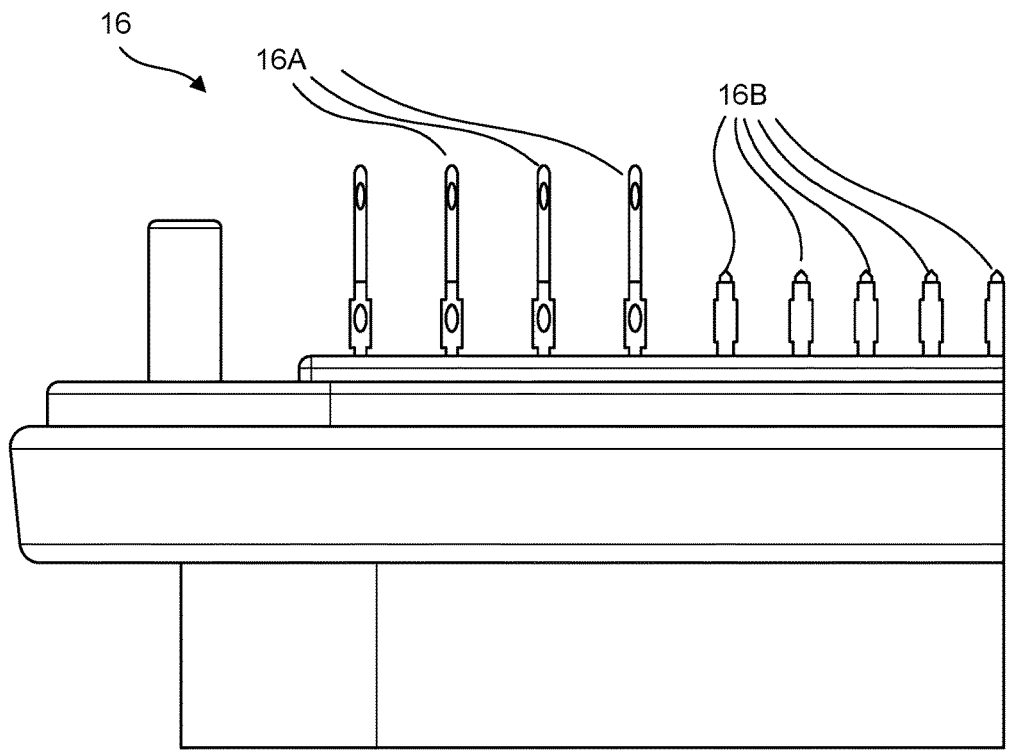
FIG. 3 is a partial side view of the connector of FIG. 2.
Figure 4:
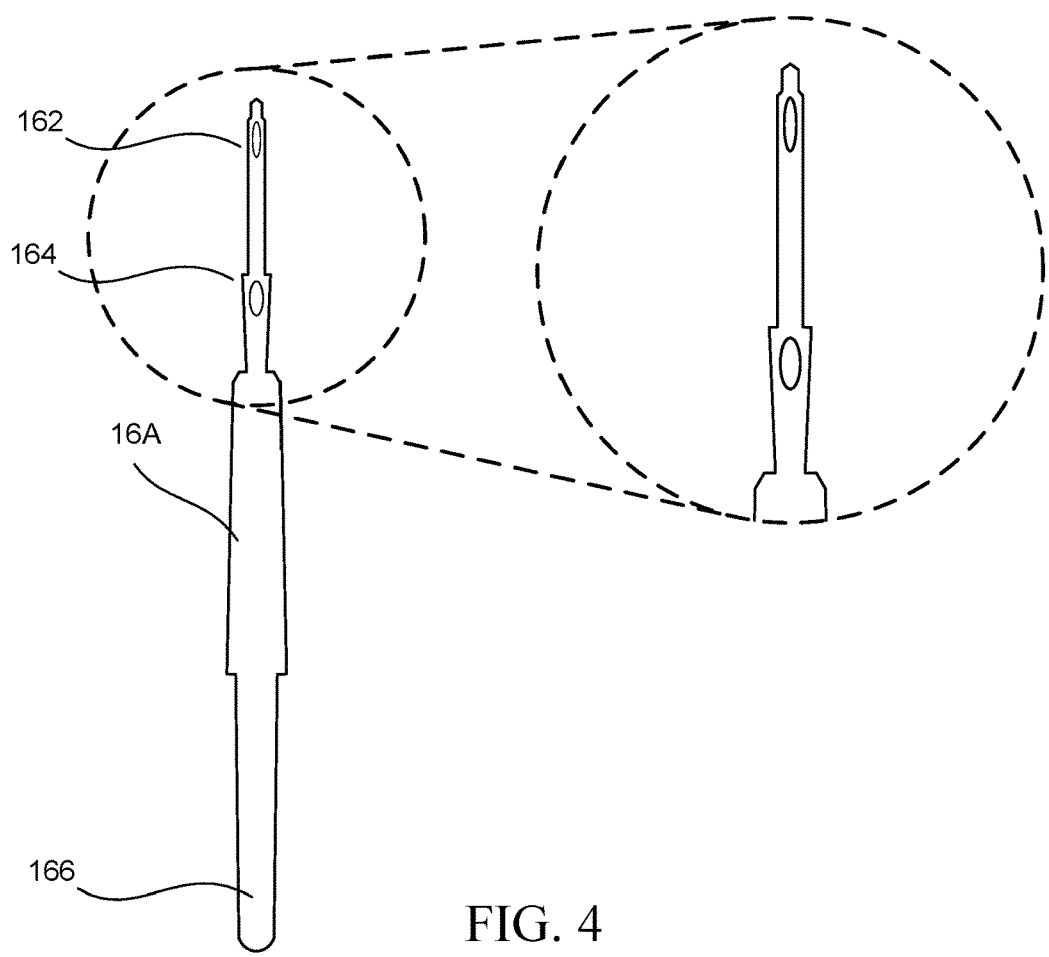
FIG. 4 is a side view of a pin connector of the connector of FIG. 2.

As shown in FIGS. 2, 3 and 4, pins 16 include a plurality of first pins 16A and a plurality of second pins 16B. First pins 16A extend further into the interior space of housing 12 than second pins 16B. In the example embodiments, each first pin 16A extends into both first PCB 18 and second PCB 20 and makes an electrical connection to each PCB. Specifically, best seen in FIG. 4, each first pin 16A includes a first compliant portion 162, second compliant portion 164 and an external connection portion 166. First compliant portion 162 is inserted into and makes a secure electrical connection with a signal trace of first PCB 18, and second compliant portion 164 is inserted into and makes a secure electrical connection with a signal trace of second PCB 20. The compliant pin portions 162, 164 thereby provide press-fit connections between the first pins 16A and the first and second printed circuit boards. External connection portion 166 is disposed within a cavity of connector 14 and provides electrical connection to a pin (female pin, in this example) of a connector (not shown) which connects to connector 14. In this way, each first pin 16A provides electrical connectivity between both PCBs and a pin in a connector which is connected to connector 14. In the example embodiments, each second pin 16B includes only a single compliant portion and an external connection portion 166 for providing electrical connectivity between second PCB 20 and a pin in a connector which is connected to connector 14.

In addition to providing electrical connectivity to first PCB 18, in example embodiments first pins 16A may provide structural support for physically and mechanically supporting first PCB 18 in a fixed position within housing 12. In an example embodiment, one or more first pins 16A may be used only to provide this structural support without providing electrical connectivity for communicating power or input/output signaling to first PCB 18.

Figure 7:
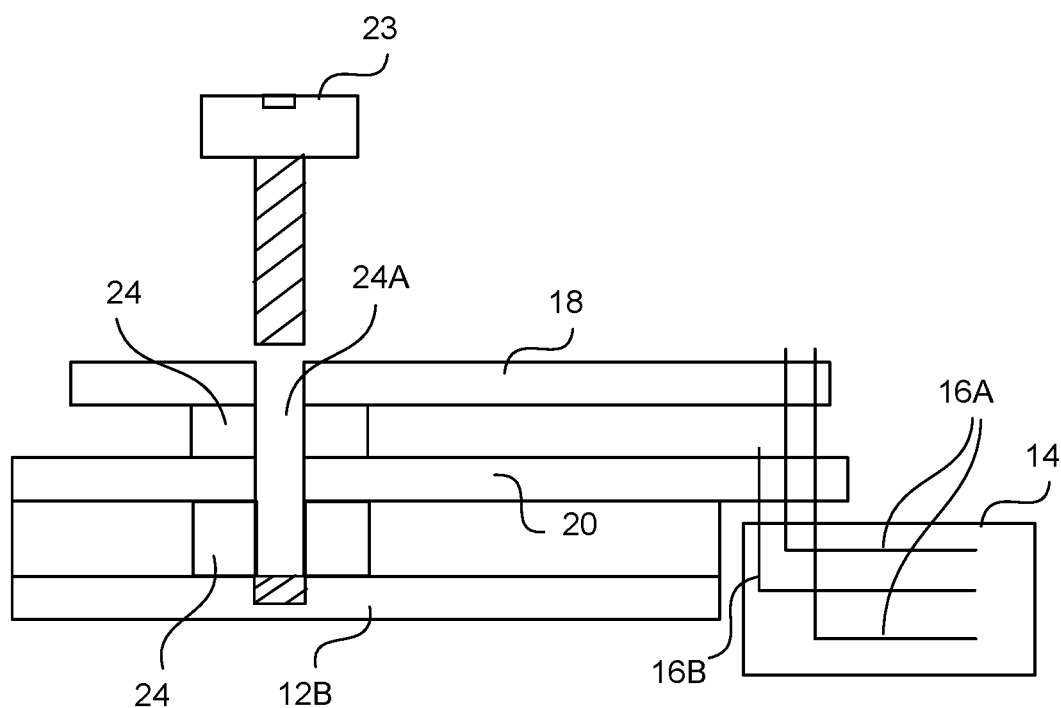
FIG. 7 is a simplified side view of the electronics control unit of FIG. 6.

The location of first pins 16A may be selected to provide for reduced signal trace congestion but also to provide structural support for supporting first PCB 18 in a stable, fixed position within housing 12. In an example embodiment, first PCB 18 may also be supported by other mechanisms. For example, FIGS. 6 and 7 show the use of standoffs or spacers 24 which are disposed between first PCB 18 and second PCB 20, and between PCB 20 and housing portion 12B. Each standoff 24 may include a through-hole 24A for receiving a fastener (FIG. 7), such as a bolt or screw 23. Best seen in FIG. 7, each through-hole 24A is disposed under a through-hole in first PCB 18 and over a threaded opening in housing portion 12B such that the bolt extends through PCBs 18 and 20 and standoffs 24, and engages with housing 12, thereby securing at least a portion of first PCB 18 and second PCB 20 in a stable and fixed position within housing 12. In this embodiment, standoffs 24 are disposed along a first portion of first PCB 18 and second PCB 20 to provide support to the first PCB portions, while pins 16A and 16B are disposed along a second portion of first PCB 18 and second PCB 20 to provide support to a second portion of first PCB 18 and second PCB 20.

As mentioned, each first pin 16A may provide electrical connectivity to both first PCB 18 and second PCB 20. Such electrical connectivity may be in providing power or reference signals to the first and second PCBs, such as power, ground and other reference signals. First pins 16A may also provide signal I/O to/from first PCB 18 and second PCB 20. In an example embodiment, first pins 16A provide only power/ground/reference signals to the first and second PCBs, and second pins 16B provide signal I/O to second PCB 20. In another example embodiment, first pins 16A only provide signal I/O to first PCB 18 and second PCB 20 and second pins 16B provide power/ground/reference signals to second PCB 20.

First PCB 18 and second PCB 20 may be organized or arranged such that first PCB 18 includes a controller 30 (FIGS. 5 and 6) for executing program instructions which control the operation of ECU 10, with second PCB 20 not including any such controller. It is understood that controller 30 may be a microcontroller, processor or the like. With this architecture, ECU 10 may be reconfigured simply by replacing first PCB 18 with another PCB having a different controller which performs a different set of functions from the functions performed by controller 30 of first PCB 18. This advantageously allows for ECU 10 to be sold to different customers, each of which may have different functionality requirements.

Electronics that needs to minimize overall x-y dimensions; the current trend in electronics is higher pin count, but same or small package which is hard to implement.

The example embodiments allow for smaller circuit layout because there may be less traces to fan out on the connector pins 16. There may be a reduced bill of material (BOM) cost by reducing both PCB size and PCB (copper) layer counts. The example embodiments may separate power and signal I/O into two PCBs. By having separate PCBs, the layout and cost may be reduced or minimized. The example embodiments join the power and signal board together with compliant pin connectors that allow multiple PCB stacking. By stacking the PCBs, the overall x-y package dimensions of the PCBs/electronics is reduced, and with it the ECU manufacturing cost. The PCBs in the stack are held together by compliant pins 16 which have multiple attachment points. By having one PCB for power pins and one board for signal pins, the electrical components are separated into two separate PCBs. The PCB traces are shorter and more easily routed, thus reducing design time PCB complexity. This may even allow a platform approach in which different ECUs may be more efficiently provided to different customers. For example, every engine controller may use the same main PCB but with an inter-changeable daughter board (first PCB 18) with micro-processor configured to each customer's desired functionality.

The example embodiments have been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

What is claimed is:

1. An electronics device, comprising:
   a first printed circuit board having a plurality of through-holes;
   a second printed circuit board having a plurality of through-holes;
   a housing in which the first and second printed circuit boards are disposed, the first printed circuit board disposed above the second printed circuit board in the housing;
   a connector attached to the housing and including a plurality of pins comprising first pins and a plurality of second pins, a length of the first pins being greater than a length of the second pins,
   wherein each of the first pins extends through one of the through-holes of the first printed circuit board and one of the through-holes of the second printed circuit board and thereby makes an electrical connection with the first and second printed circuit boards, and each of the second pins only extends through one of the through-holes of the second printed circuit board and thereby makes an electrical connection with the second printed circuit board.

2. The electronics device of claim 1, wherein the connector is positioned closer to the second printed circuit board than the first printed circuit board.

3. The electronics device of claim 1, wherein the electronics device forms at least part of a system, with the first pins carrying system signals and the second pins carrying power supply signals.

4. The electronics device of claim 1, wherein the first pins are inserted in the through-holes of the first printed circuit board that are located along a first portion thereof, and the electronics device comprises at least one fastener which is inserted through the first and second printed circuit boards and engages with the housing, the at least one fastener is disposed along a second portion of the first printed circuit board, the fastener and the first pins fixing the first printed circuit board in position within the housing.

5. The electronics device of claim 1, wherein each first pin includes a first compliant portion which engages with the corresponding through-hole of the first printed circuit board, and a second compliant portion which engages with the corresponding through-hole of the second printed circuit board.

6. The electronics device of claim 5, wherein the first printed circuit board has a square or rectangular prism shape and the first pins extend through the corresponding through-holes of the first printed circuit board that are defined through corner regions of the first printed circuit board.

7. The electronics device of claim 1, wherein the first printed circuit board includes at least one processor or controller and the second printed circuit board includes at least one electrical component having a heat sink or at least one discrete component.

8. The electronics device of claim 7, wherein the second printed circuit board includes no processor or controller.

9. The electronics device of claim 7, wherein the processor or controller of the first printed circuit board is programmable and the second printed circuit board does not include a programmable component.

10. The electronics device of claim 7, wherein the electronics device is modular in that the first printed circuit board is one of a plurality of first printed circuit boards which are insertable in the electronics device, each of the first printed circuit boards being configured for different functionality relative to functionality of other of the first printed circuit boards.

11. The electronics device of claim 7, wherein the first printed circuit board is smaller than the second printed circuit board.

12. A control unit, comprising:
a housing;
a first printed circuit board disposed in the housing and having a plurality of through-holes defined therethrough;
a second printed circuit board disposed in the housing and having a plurality of through-holes defined therethrough, the first and second printed circuit boards being in a stacked arrangement within the housing; and
a plurality of pins including a plurality of first pins and a plurality of second pins, each of the first pins is configured to extend into a through-hole of the first printed circuit board and a through-hole of the second printed circuit board, and each of the second pins is configured to extend into a through-hole of the second printed circuit board, each first pin carrying a power signal and each second pin carrying an input/output signal of the control unit.

13. The control unit of claim 12, wherein the first printed circuit board includes at least one processor or controller and the second printed circuit board does not include a processor or controller.

14. The control unit of claim 12, wherein the first printed circuit board has a rectangular prism shape and the first pins extend through the through-holes of the first printed circuit board in corner regions thereof.

15. The control unit of claim 12, wherein the first pins extend through the through-holes of the first printed circuit board that are located along a first portion thereof, and the control unit further comprises one or more fasteners which extend through the first printed circuit board and engage with the housing, the fasteners positioned along a second portion of the first printed circuit board opposite the first portion thereof.

16. The control unit of claim 12, wherein the control unit is modular in that the first printed circuit board is one of a plurality of first printed circuit boards which are insertable in the electronics device during assembly of the control unit, each of the first printed circuit boards being configured for different functionality relative to functionality of the other first printed circuit boards.

17. The control unit of claim 12, further comprising a connector attached to the housing, wherein the first and second pins are disposed at least partly in and forming part of the connector.

18. The control unit of claim 17, wherein each first pin comprises a first compliant pin portion which is inserted in a corresponding through-hole of the first printed circuit board and a second compliant pin portion which is inserted in a corresponding through-hole of the second printed circuit portion.

* * * * *